(12) United States Patent
Pal et al.

(10) Patent No.: US 12,402,351 B2
(45) Date of Patent: Aug. 26, 2025

(54) GATE ALL AROUND DEVICE WITH FULLY-DEPLETED SILICON-ON-INSULATOR

(71) Applicant: Applied Materials, Inc., Santa Clara, CA (US)

(72) Inventors: Ashish Pal, San Ramon, CA (US); El Mehdi Bazizi, San Jose, CA (US); Benjamin Colombeau, San Jose, CA (US); Myungsun Kim, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 452 days.

(21) Appl. No.: 17/583,355

(22) Filed: Jan. 25, 2022

(65) Prior Publication Data

US 2022/0246742 A1 Aug. 4, 2022

Related U.S. Application Data

(60) Provisional application No. 63/144,007, filed on Feb. 1, 2021.

(51) Int. Cl.
*H10D 30/67* (2025.01)
*H10D 30/01* (2025.01)
(Continued)

(52) U.S. Cl.
CPC ....... *H10D 30/6735* (2025.01); *H10D 30/014* (2025.01); *H10D 30/43* (2025.01);
(Continued)

(58) Field of Classification Search
CPC ........... H01L 29/42392; H01L 29/0669; H01L 29/15; H01L 29/78618; H01L 29/78696;
(Continued)

(56) References Cited

U.S. PATENT DOCUMENTS 8,778,768 B1 * 7/2014 Chang ................. H01L 29/0673
438/303
9,484,270 B2 11/2016 Hook et al.
(Continued)

FOREIGN PATENT DOCUMENTS

KR 20110060924 A 6/2011

OTHER PUBLICATIONS

Loubet, N. , et al., "Stacked Nanosheet Gate-All-Around Transistor to Enable Scaling Beyond FinFET", 2017 Symposium on VLSI Technology Digest of Technical Papers, 2 pages.
(Continued)

*Primary Examiner* — Ida M Soward
(74) *Attorney, Agent, or Firm* — Servilla Whitney LLC (57) ABSTRACT

Horizontal gate-all-around devices and methods of manufacturing are described. The hGAA devices include a fully-depleted silicon-on-insulator (FD-SOI) under the channel layers in the same footprint as the hGAA. The buried dielectric insulating layer of the FD-SOI includes one or more of silicon oxide (SiOx), silicon nitride (SiN), silicon carbide (SiC), and a high-k material, and the buried dielectric insulating layer has a thickness in a range of from 0 nm to 10 nm.

12 Claims, 5 Drawing Sheets

(51) Int. Cl.
*H10D 30/43* (2025.01)
*H10D 62/10* (2025.01)
*H10D 62/13* (2025.01)
*H10D 64/01* (2025.01)
*H10D 30/00* (2025.01)

(52) U.S. Cl.
CPC ..... *H10D 30/6713* (2025.01); *H10D 30/6757* (2025.01); *H10D 62/121* (2025.01); *H10D 62/151* (2025.01); *H10D 64/017* (2025.01); *H10D 30/501* (2025.01); *H10D 30/502* (2025.01); *H10D 30/507* (2025.01); *H10D 62/123* (2025.01); *Y10S 977/938* (2013.01)

(58) Field of Classification Search
CPC . H01L 29/0673; H01L 29/775; H01L 29/068; Y10S 977/938; H10D 30/6735; H10D 30/43; H10D 30/6713; H10D 30/6757; H10D 30/503; H10D 30/502; H10D 30/507; H10D 62/121; H10D 62/151; H10D 62/123; H10D 64/252; H10D 84/201; H10D 30/501; H10D 62/119; H10D 64/017; H10H 20/826; B82Y 10/00
See application file for complete search history.

(56) References Cited

U.S. PATENT DOCUMENTS

| | | | |
|---|---|---|---|
| 9,502,564 B2 | 11/2016 | Moll et al. | |
| 9,893,161 B2 * | 2/2018 | Nakamura | H01L 29/1037 |
| 10,573,755 B1 * | 2/2020 | Frougier | H10D 30/6743 |
| 10,840,352 B2 * | 11/2020 | Rachmady | H01L 29/66439 |
| 11,257,917 B2 * | 2/2022 | Yuan | H01L 29/1079 |
| 2001/0045606 A1 | 11/2001 | Kanamori | |
| 2014/0065794 A1 | 3/2014 | Kar et al. | |
| 2014/0225065 A1 * | 8/2014 | Rachmady | H01L 29/775 438/283 |
| 2015/0270340 A1 * | 9/2015 | Frank | H01L 21/31111 438/151 |
| 2017/0179299 A1 | 6/2017 | Bae | |
| 2017/0271475 A1 * | 9/2017 | Chang | H01L 21/0223 |
| 2018/0277656 A1 * | 9/2018 | Chao | H01L 21/3065 |
| 2020/0043808 A1 * | 2/2020 | Bao | H01L 21/3215 |
| 2020/0083219 A1 | 3/2020 | Kang et al. | |
| 2021/0335789 A1 * | 10/2021 | Zhu | H10D 30/6728 |
| 2021/0399099 A1 * | 12/2021 | Chu | H01L 21/76831 |
| 2022/0149172 A1 * | 5/2022 | Tsai | H10D 30/796 |
| 2022/0359265 A1 * | 11/2022 | Chang | H01L 23/485 |
| 2023/0352567 A1 * | 11/2023 | Chung | H10D 30/6735 |

OTHER PUBLICATIONS

Zhang, J., et al., "Full Bottom Dielectric Isolation to Enable Stacked Nanosheet Transistor for Low Power and High Performance Applications", 2019 IEEE International Electron Devices Meeting (IEDM), 4 pages.

PCT International Search Report and Written Opinion in PCT/US2022/014258 dated May 12, 2022, 11 pages.

* cited by examiner

GATE ALL AROUND DEVICE WITH FULLY-DEPLETED SILICON-ON-INSULATOR

CROSS-REFERENCE TO RELATED APPLICATIONS

This application claims priority to U.S. Provisional Application No. 63/144,007, filed Feb. 1, 2021, the entire disclosure of which is hereby incorporated by reference herein.

TECHNICAL FIELD

Embodiments of the disclosure generally relate to semiconductor devices. More particularly, embodiments of the disclosure are directed to gate all around (GAA) devices having a fully-depleted silicon-on-insulator (FD-SOI) transistor within the device and methods of manufacture thereof.

BACKGROUND

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (FinFETs) have been developed to address the conflicting goals of a transistor having maximum drive current and minimum size. FinFETs are characterized by a fin-shaped channel region that greatly increases the size of the transistor without significantly increasing the footprint of the transistor and are now being applied in many integrated circuits. However, FinFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a horizontal gate all around (hGAA) structure. The hGAA device structure includes several lattice matched channels suspended in a stacked configuration and connected by source/drain regions. The hGAA structure provides good electrostatic control and can find broad adoption in complementary metal oxide semiconductor (CMOS) wafer manufacturing.

As CMOS logic technology dimensions are scaled down, the demand to produce higher drive current in a smaller transistor footprint grows. The higher drive current helps to increase the frequency of the final chip built using these devices. Transistor drive current can no longer be increased by just scaling its dimension. Accordingly, new techniques of increasing the drive current are needed to continue the scaling of devices.

SUMMARY

One or more embodiments of the disclosure are directed to semiconductor devices. In one or more embodiments, a semiconductor device comprises: a plurality of horizontal channel layers between a source region and a drain region, the plurality of horizontal channel layers having a top surface, a bottom surface, and two side surfaces; a gate surrounding the plurality of horizontal channel layers; a silicon region on the bottom surface of the plurality of horizontal channel layers, the silicon region having a top surface and a bottom surface; and a buried dielectric insulating layer on the bottom surface of the silicon region and extending from the source region to the drain region, the buried dielectric insulating layer disposed on a substrate.

Additional embodiments of the disclosure are directed to methods of forming semiconductor devices. In one or more embodiments, the method comprises: forming a superlattice structure on a top surface of a substrate, the superlattice structure comprising a plurality of channel layers and a corresponding plurality of semiconductor material layers alternatingly arranged in a plurality of stacked pairs; forming a dummy gate on a top surface of the superlattice structure; forming a source trench and a drain trench adjacent to the superlattice structure, the plurality of semiconductor material layers and plurality of channel layers extending between the source trench and the drain trench; forming an opening on a bottom surface of the superlattice structure; and forming a buried dielectric isolation layer in the source trench, the drain trench, and in the opening, the buried dielectric isolation layer having a thickness.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "precursor", "reactant", "reactive gas" and the like are used interchangeably to refer to any gaseous species that can react with the substrate surface.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source(S), through which the carriers enter the channel; drain (D), through which the carriers leave the channel; and gate (G), the terminal that modulates the channel conductivity. Conventionally, current entering the channel at the source(S) is designated Is and current entering the channel at the drain (D) is designated $I_D$. Drain-to-source voltage is designated $V_{DS}$. By applying voltage to gate (G), the current entering the channel at the drain (i.e., $I_D$) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is an n region. The source is so named because it is the source of the charge carriers (electrons for n-channel, holes for p-channel) that flow through the channel; similarly, the drain is where the charge carriers leave the channel.

As used herein, the term "fin field-effect transistor (FinFET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nano-wires or nano-slabs or nano-sheets, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nanostructure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices. As used herein, the term "nanosheet" refers to a two-dimensional nanostructure with a thickness in a scale ranging from about 0.1 nm to about 1000 nm, or from 0.5 nm to 500 nm, or from 0.5 nm to 100 nm, or from 1 nm to 500 nm, or from 1 nm to 100 nm, or from 1 nm to 50 nm.

As used herein, the term "silicon-on-insulator (SOI)" refers to the fabrication of silicon semiconductor devices in a layered silicon-insulator-silicon substrate, to reduce parasitic capacitance within the device, thereby improving performance. SOI-based devices differ from conventional silicon-built devices in that the silicon junction is above an electrical insulator, typically silicon dioxide.

As used herein, the term "fully-depleted silicon-on-insulator (FD-SOI)" transistor refers to a semiconductor device that uses an ultra-thin layer of silicon over a buried oxide to reduce leakage and variation on chips. FD-SOI also have a back-bias feature. In a FD-SOI, the channel is not doped, so the transistor is fully depleted.

In the method of one or more embodiments, gate all-around transistors are fabricated using a standard process flow. After the dummy gate removal, a fully-depleted silicon-on-insulator (FD-SOI) transistor is formed underneath the nanosheets. In one or more embodiments, a FD-SOI channel is added to the gate all around device for current flow below the gate all around transistor, reducing overall channel resistance. In one or more embodiments, the presence of the FD-SOI transistor advantageously improves the drive current and performance of the gate all around device without increasing the size/footprint of the device. In one or more embodiments, buried dielectric isolation technology is used to create an additional FD-SOI channel underneath the existing GAA transistor. In one or more embodiments, the thickness of the channel can be adjusted to control the short channel characteristics. In one or more embodiments, the channel thickness also dictates the drive current benefit that can be achieved.

The embodiments of the disclosure are described by way of the Figures, which illustrate devices (e.g., transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

Figure 1:
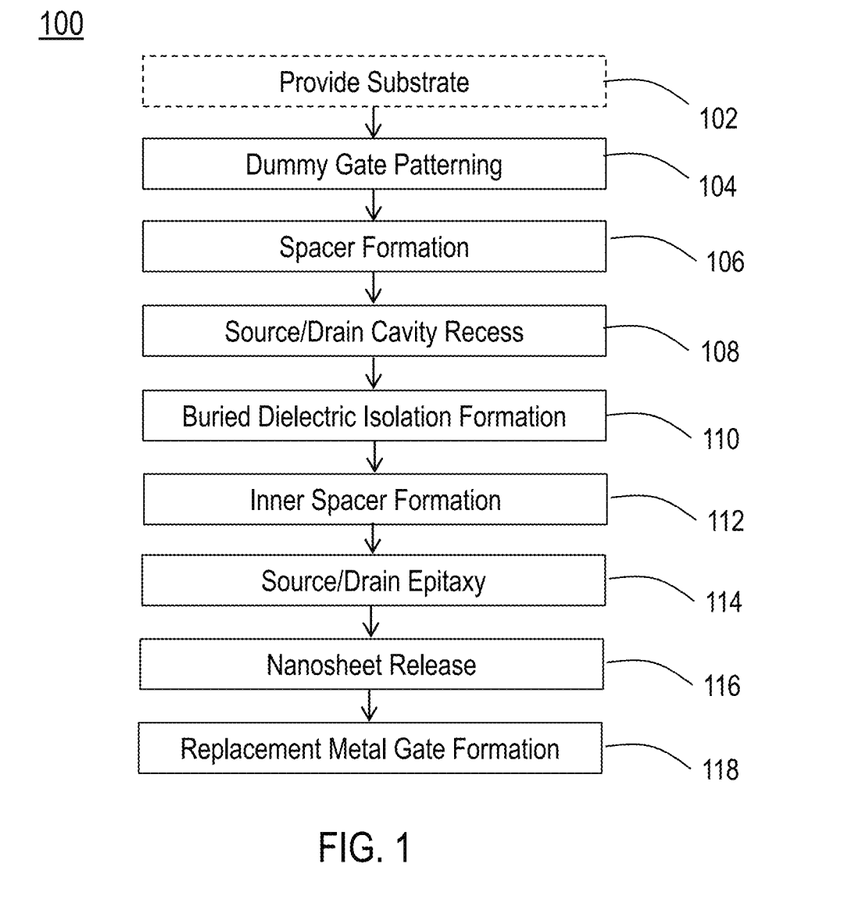
FIG. 1 illustrates a process flow diagram of a method for forming a semiconductor device in accordance with some embodiments of the present disclosure.

FIG. 1 illustrates a process flow diagram for a method 100 for forming a semiconductor device in accordance with some embodiments of the present disclosure. The method 100 is described below with respect to FIGS. 2A-2J, which depicts the stages of fabrication of semiconductor structures in accordance with some embodiments of the present disclosure. FIGS. 2A-2J are cross-sectional views of an electronic device (e.g., hGAA) according to one or more embodiments. The method 100 may be part of a multi-step fabrication process of a semiconductor device. Accordingly, the method 100 may be performed in any suitable process chamber coupled to a cluster tool. The cluster tool may include process chambers for fabricating a semiconductor device, such as chambers configured for etching, deposition, physical vapor deposition (PVD), chemical vapor deposition (CVD), oxidation, or any other suitable chamber used for the fabrication of a semiconductor device.

Figure 2A:
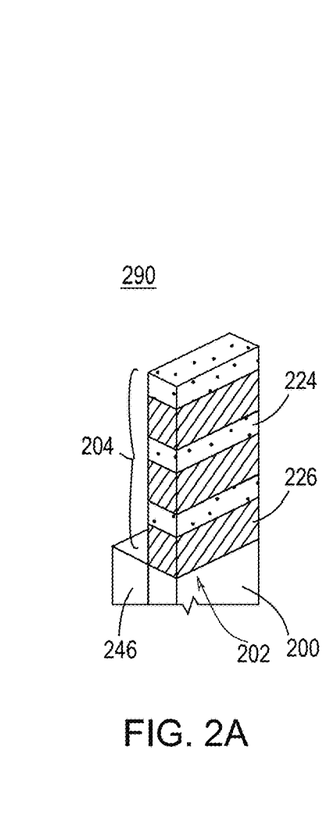
FIG. 2A illustrates a cross-section view of a device according to one or more embodiments.

The method 100 of forming the GAA device 290 begins at operation 102, by providing a substrate 200 having a top surface 202 (as illustrated in FIG. 2A). In some embodiments, the substrate 200 may be a bulk semiconductor substrate. As used herein, the term "bulk semiconductor substrate" refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In some embodiments, the semiconductor material is silicon (Si). In one or more embodiments, the semiconductor substrate 200 comprises a semiconductor material, e.g., silicon (Si), carbon (C), germanium (Ge), silicon germanium (SiGe), germanium tin (GeSn), other semiconductor materials, or any combination thereof. In one or more embodiments, the substrate 200 comprises one or more of silicon (Si), germanium (Ge), gallium (Ga), arsenic (As), or phosphorus (P). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, the semiconductor material may be a doped material, such as n-doped silicon (n-Si), or p-doped silicon (p-Si). In some embodiments, the substrate may be doped using any suitable process such as an ion implantation process. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. In one or more embodiments, the dopant is selected from one or more of boron (B), gallium (Ga), phosphorus (P), arsenic (As), other semiconductor dopants, or combinations thereof. In some embodiments, the substrate may be doped to provide a high dose of dopant at a first location of the top surface 202 of the substrate 200 in order to prevent parasitic bottom device turn on. In one or more embodiments, a superlattice structure 204 is formed atop the first location of the top surface 202 of the substrate 200. For example, in some embodiments, the top surface 202 of the substrate 200 may have a dopant density about $10^{18}$ atoms/cm$^3$ to about $10^{19}$ atoms/cm$^3$.

At least one superlattice structure 204 is formed atop the top surface 202 of the substrate 200 (as depicted in FIG. 2A). The superlattice structure 204 comprises a plurality of semiconductor material layers 226 and a corresponding plurality of channel layers 224 alternatingly arranged in a plurality of stacked pairs. In some embodiments the plurality of stacked groups of layers comprise a silicon (Si), germanium (Ge), or silicon germanium (SiGe) group. In some embodiments, the silicon germanium (SiGe) may contain germanium (Ge) in a mole fraction amount in a range of from 0% to 50%. In some embodiments, the plurality of semiconductor material layers 226 comprise silicon germanium (SiGe), and the plurality of channel layers 224 comprise silicon (Si). In some embodiments, the plurality of semiconductor material layers 226 and corresponding plurality of channel layers 224 can comprise any number of lattice matched material pairs suitable for forming a superlattice structure 204. In some embodiments, the plurality of semiconductor material layers 226 and corresponding plurality of channel layers 224 comprise from about 2 to about 50 pairs of lattice matched materials.

In one or more embodiments, the thickness of the plurality of semiconductor material layers 226 and the plurality of channel layers 224 are in the range of from about 2 nm to about 50 nm, in the range of from about 3 nm to about 20 nm, or in a range of from about 2 nm to about 15 nm.

In some embodiments, the plurality of channel layers 224 may be doped with one or more of phosphorus (P), arsenic (As), boron (B), and gallium (Ga). The doping concentration of the plurality of channel layers 224 may be in a range of from 1e14 cm$^{-3}$ to 1e19 cm$^{-3}$.

In some embodiments, a dielectric material 246 is deposited on the substrate 200 using conventional chemical vapor deposition methods. In some embodiments, the dielectric material 246 is recessed below the top surface 202 of the substrate 200 so that the bottom portion of the superlattice structure 204 is formed from the substrate 200.

Figure 2B:
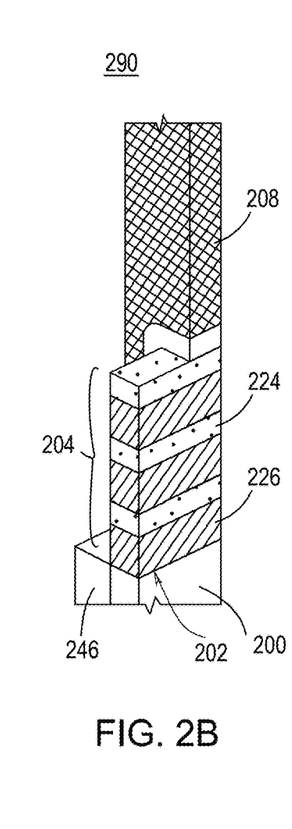
FIG. 2B illustrates a cross-section view of a device according to one or more embodiments.

Referring to FIG. 2B, in some embodiments, a dummy gate structure 208 is formed and patterned over the superlattice structure 204. The dummy gate structure 208 defines the channel region of the transistor device. The dummy gate structure 208 may be formed using any suitable conventional deposition and patterning process known in the art. The dummy gate structure 208 may comprise any suitable material known to one of skill in the art. In some embodiments, the dummy gate structure 208 comprises one or more of a dummy gate metal layer and a dummy gate polysilicon layer.

Figure 2C:
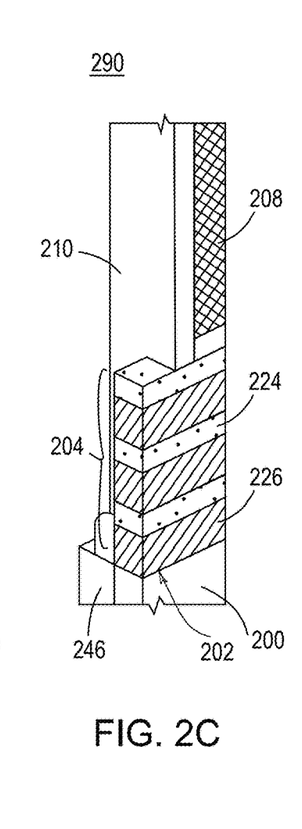
FIG. 2C illustrates a cross-section view of a device according to one or more embodiments.

With reference to FIG. 2C, in some embodiments, sidewall spacers 210 are formed along outer sidewalls of the dummy gate structure 208. The sidewall spacers 210 of some embodiments comprise suitable insulating materials known in the art, for example, silicon nitride, silicon oxide, silicon oxynitride, silicon carbide, or the like. In some embodiments, the sidewall spacers 210 are formed using any suitable conventional deposition and patterning process known in the art, such as atomic layer deposition, plasma enhanced atomic layer deposition, plasma enhanced chemical vapor deposition or low-pressure chemical vapor deposition.

Figure 2D:
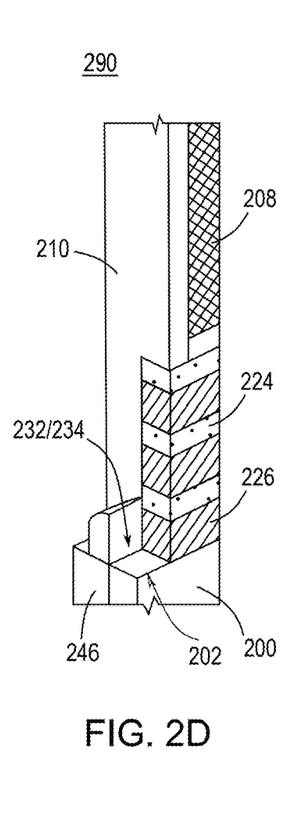
FIG. 2D illustrates a cross-section view of a device according to one or more embodiments.

Referring to FIG. 2D, at operation 108, in some embodiments, a source trench 232 and a drain trench 234 are formed on either side of, adjacent to, the superlattice structure 204. In some embodiments, the source trench 232 is formed adjacent a first end of the superlattice structure 204 and the drain trench 234 is formed adjacent a second, opposing end of the superlattice structure 204. In the embodiment illustrated in FIG. 2D, one of the source trench 232 or drain trench 234 is not shown at the front face of the superlattice structure 204. The other end of the superlattice structure 204 has the other of the source trench 232 or drain trench 234.

Figure 2E:
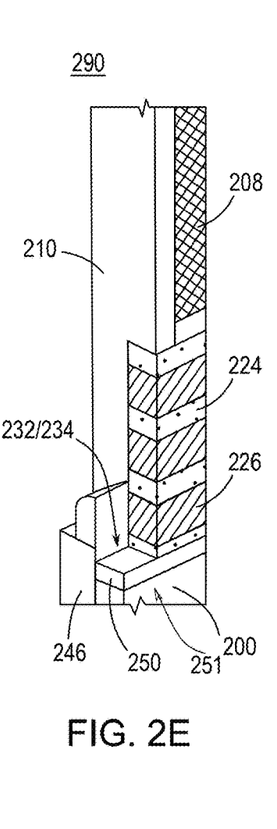
FIG. 2E illustrates a cross-section view of a device according to one or more embodiments.

With reference to FIG. 2E, at operation 110, a buried dielectric isolation (BDI) layer 250 and fully-depleted silicon-on-insulator (FD-SOI) 251 is formed under the superlattice structure 204. In one or more embodiments, an opening (not illustrated) is formed under the nanosheets of the superlattice structure 204. In one or more embodiments, the opening may be formed by isotropically etching under the superlattice structure 204. In some embodiments, the superlattice structure 204 comprises alternating layers of silicon and silicon germanium, which are isotropically etched to form an opening under the super lattice structure 204.

With reference to FIG. 2E, the buried dielectric isolation (BDI) layer 250 and fully-depleted silicon-on-insulator (FD-SOI) 251 is formed in the source/drain trench 232/234 and opening under the superlattice structure 204. The buried dielectric isolation (BDI) layer 250 and fully-depleted silicon-on-insulator (FD-SOI) 251 may comprise any suitable material known to the skilled artisan. In one or more embodiments, buried dielectric isolation (BDI) layer 250 and fully-depleted silicon-on-insulator (FD-SOI) 251 comprises one or more of silicon oxide ($SiO_x$), silicon nitride (SiN), silicon carbide (SiC), or a high-k material. In some embodiments, the high-k material is selected from one or more of aluminum oxide ($Al_2O_3$), hafnium oxide ($HfO_2$), and the like. In one or more specific embodiments, the buried dielectric isolation (BDI) layer 250 and fully-depleted silicon-on-insulator (FD-SOI) 251 comprises silicon oxide.

In one or more embodiments, the thickness, $t_B$, of the buried dielectric isolation (BDI) layer 250 and fully-depleted silicon-on-insulator (FD-SOI) 251 may be adjusted. Without intending to be bound by theory, it is believed that decreasing the thickness of the buried dielectric isolation (BDI) layer 250 and fully-depleted silicon-on-insulator (FD-SOI) 251 results in a decrease in the capacitance and an improvement in the drive current of the GAA device 290. In one or more embodiments, the thickness, $t_B$, of the buried dielectric isolation (BDI) layer 250 and fully-depleted silicon-on-insulator (FD-SOI) 251 is in a range of from 0 nm to 10 nm, including a range of from 1 nm to 9 nm, a range of from 2 nm to 8 nm, and a range of from 3 nm to 7 nm. In one or more embodiments, the thickness, $t_B$, of buried dielectric isolation (BDI) layer 250 and fully-depleted silicon-on-insulator (FD-SOI) 251 is less than 10 nm, including less than 9 nm, less than 8 nm, less than 7 nm, less than 6 nm, less than 5 nm, less than 4 nm, less than 3 nm, less than 2 nm, and less than 1 nm. In one or more embodiments, the thickness, $t_B$, of buried dielectric isolation (BDI) layer 250 and fully-depleted silicon-on-insulator (FD-SOI) 251 is greater than 0 nm, including greater than 1 nm, greater than 2 nm, greater than 3 nm, greater than 4 nm, greater than 5 nm, greater than 6 nm, greater than 7 nm, greater than 8 nm, and greater than 9 nm. In one or more embodiments, thickness, $t_B$, of the buried dielectric isolation (BDI) layer 250 and fully-depleted silicon-on-insulator (FD-SOI) 251 is 0 nm, 0.25 nm, 0.5 nm, 0.75 nm, 1 nm, 1.25 nm, 1.5 nm, 1.75 nm, 2 nm, 2.25 nm, 2.5 nm, 2.75 nm, 3 nm, 3.25 nm, 3.5 nm, 3.75 nm, 4 nm, 4.25 nm, 4.5 nm, 4.75 nm, 5 nm, 5.25 nm, 5.5 nm, 5.75 nm, 6 nm, 6.25 nm, 6.5 nm, 6.75 nm, 7 nm, 7.25 nm, 7.5 nm. 7.75 nm, 8 nm, 8.25 nm, 8.5 nm, 8.75 nm, 9 nm, 9.25 nm, 9.5 nm, 9.75 nm, or 10 nm.

Figure 2F:
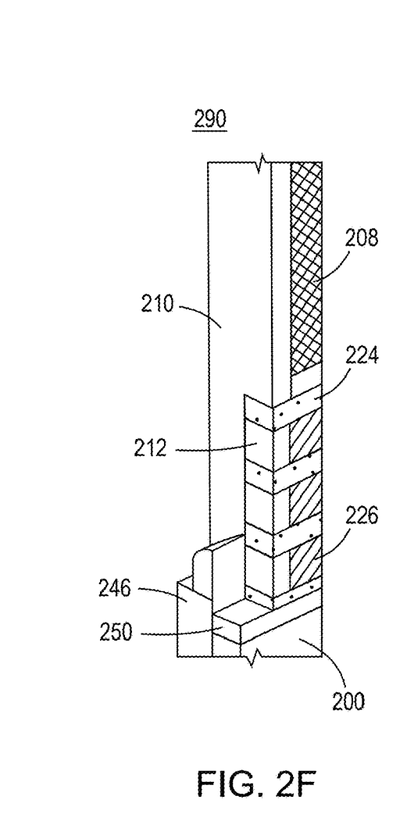
FIG. 2F illustrates a cross-section view of a device according to one or more embodiments.
Figure 2G:
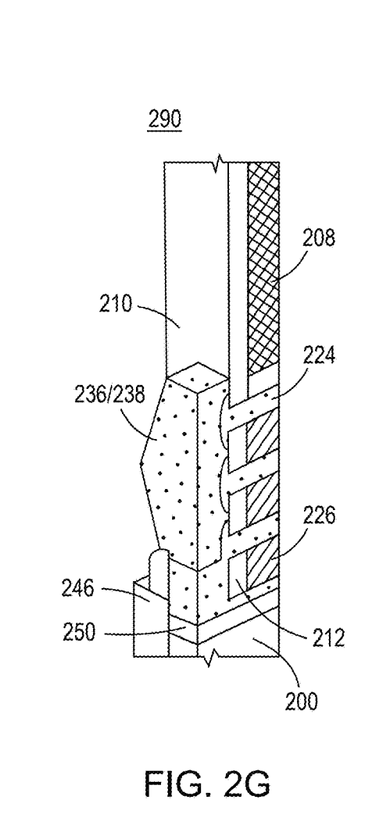
FIG. 2G illustrates a cross-section view of a device according to one or more embodiments.

In operation 112, as shown in FIG. 2F, an inner spacer 212 is formed by selectively recessing the semiconductor material layers 226 from the source/drain trench 232/234. The inner spacer 212 of some embodiments comprise suitable insulating materials known in the art, for example, silicon nitride, silicon oxide, silicon oxynitride, silicon carbide, or the like. In some embodiments, the inner spacer 212 are formed using any suitable conventional deposition and patterning process known in the art, such as atomic layer deposition, plasma enhanced atomic layer deposition, plasma enhanced chemical vapor deposition or low-pressure chemical vapor deposition.

In operation 114, the source region 236 and/or the drain region 238 are formed in the source/drain trench 232/234. In some embodiments, the source region 236 and/or drain region 238 are formed from any suitable semiconductor material, such as but not limited to silicon, germanium, silicon germanium, silicon phosphorous, silicon arsenic, or the like. In one or more embodiments, the source region 236 and the drain region 238 may independently be doped with one or more of phosphorus (P), arsenic (As), boron (B), and gallium (Ga). In some embodiments, the source region 236 and the drain region 238 may independently have a doping concentration in a range of from 1e19 $cm^{-3}$ to 5e21 $cm^{-3}$.

In some embodiments, the source region 236 and drain region 238 may be formed using any suitable deposition process, such as an epitaxial deposition process.

Figure 2H:
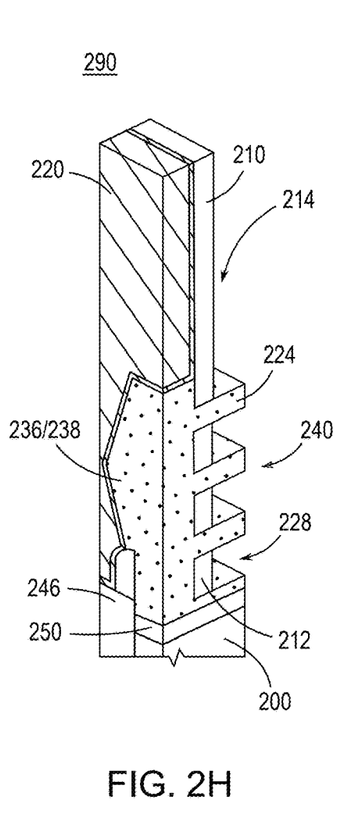
FIG. 2H illustrates a cross-section view of a device according to one or more embodiments.

Referring to FIG. 2H, in some embodiments, an interlayer dielectric (ILD) layer 220 is blanket deposited over the source/drain regions 236/238, the dummy gate structure 208, and the sidewall spacers 210. The ILD layer 220 may be deposited using a conventional chemical vapor deposition method (e.g., plasma enhance chemical vapor deposition and low-pressure chemical vapor deposition). In one or more embodiments, ILD layer 220 is formed from any suitable dielectric material such as, but not limited to, undoped silicon oxide, doped silicon oxide (e.g., BPSG, PSG), silicon nitride, and silicon oxynitride. In one or more embodiments, ILD layer 220 is then polished back using a conventional chemical mechanical planarization method to expose the top of the dummy gate structure 208. In some embodiments, the ILD layer 220 is polished to expose the top of the dummy gate structure 208 and the top of the sidewall spacers 210.

In operation 116, as shown in FIG. 2H, the dummy gate structure 208 is removed to expose the channel region 214 of the superlattice structure 204. The ILD layer 220 protects the source/drain regions 236/238 during the removal of the dummy gate structure 208. The dummy gate structure 208 may be removed using any conventional etching method such as a plasma dry etch or a wet etch. In some embodiments, the dummy gate structure 208 comprises poly-silicon and the dummy gate structure 208 is removed by a selective etch process. In some embodiments, the dummy gate structure 208 comprises polysilicon and the superlattice structure 204 comprises alternating layers of silicon (Si) and silicon germanium (SiGe).

In operation 116, as shown in FIG. 2H, the plurality of semiconductor material layers 226 are selectively etched between the plurality of channel layers 224 in the superlattice structure 204. For example, where the superlattice structure 204 is composed of silicon (Si) layers and silicon germanium (SiGe) layers, the silicon germanium (SiGe) is selectively etched to form voids 228. The plurality of semiconductor material layers 226, for example silicon germanium (SiGe), may be removed using any well-known etchant that is selective to the plurality of channel layers 224, for example silicon (Si), where the etchant etches the plurality of semiconductor material layers 226 at a significantly higher rate than the plurality of channel layers 224. In some embodiments, a selective dry etch or wet etch process may be used. In some embodiments, where the plurality of channel layers 224 are silicon (Si) and the plurality of semiconductor material layers 226 are silicon germanium (SiGe), the layers of silicon germanium may be selectively removed to form voids 228 using a wet etchant such as, but not limited to aqueous carboxylic acid/nitric acid/HF solution and aqueous citric acid/nitric acid/HF solution.

In one or more embodiments, as illustrated in FIG. 2H, the removal of the plurality of semiconductor material layers 226 leaves voids 228 between the plurality of channel layers 224. The voids 228 between the plurality of channel layers 224 have a thickness of about 3 nm to about 20 nm. The remaining channel layers 224 form a vertical array of channel nanowires 240 that are coupled to the source/drain regions 232, 234. The vertical array of channel nanowires 240 run parallel to the top surface of the substrate 200 and are aligned with each other to form a single column of channel nanowires 240. The formation of the source region 236 and drain region 238 and the formation of an optional lateral etch stop layer advantageously provide self-alignment and structural integrity in the formation of the channel structure.

The isotropic etch process may include any suitable etch process that is selective to the semiconductor material of the plurality of channel layers 224. In some embodiments the isotropic etch process of operation 116 comprises one or more of a wet etch process or a dry etch process. In some embodiments, the isotropic etch process of operation 116 comprises a dry etch process.

In one or more embodiments, operation 118 of method 100 represents one or more post-FD-SOI processing operations. The one or more post-FD-SOI processes can by any of the processes known to the skilled artisan for completion of the hGAA device, e.g., replacement metal gate structure 256 formation. For example, in one or more unillustrated embodiments, a high-k dielectric is formed. The high-k dielectric can be any suitable high-k dielectric material deposited by any suitable deposition technique known to the skilled artisan. The high-k dielectric of some embodiments comprises hafnium oxide. In some embodiments, a conductive material such as titanium nitride (TiN), tungsten (W), cobalt (Co), aluminum (Al), or the like is deposited on the high-k dielectric. The conductive material may be formed using any suitable deposition process such as, but not limited to, atomic layer deposition (ALD) in order to ensure the formation of the replacement metal gate structure 256 having a uniform thickness around each of the plurality of channel layers 224.

Figure 2I:
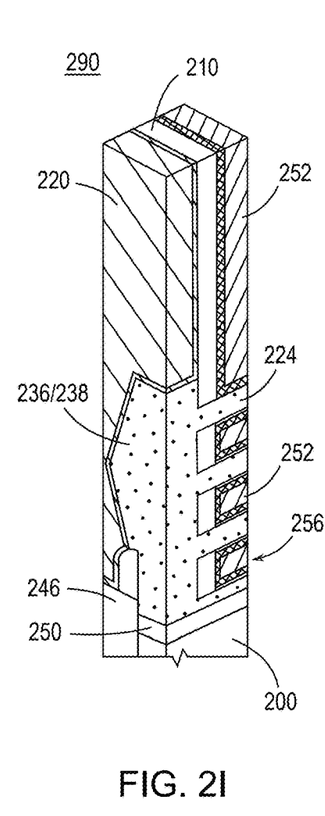
FIG. 2I illustrates a cross-section view of a device according to one or more embodiments.

In one or more embodiments, as illustrated in FIG. 2I, the replacement metal gate structure 256 includes a gate electrode 252 formed in the voids 228 between the plurality of channel layers 224. The gate electrode may be formed from any suitable gate electrode material known in the art. The gate electrode material is deposited using any suitable deposition process such as atomic layer deposition (ALD) to ensure that gate electrode 252 is formed around and between each of the plurality of channel layers 224. In one or more embodiments, the gate electrode is deposited by CVD because there is limited space available between the nanosheets for the gate electrode to fit. In one or more embodiments, the gate electrode 252 comprises one or more of titanium nitride (TiN), tantalum nitride (TaN), tungsten (W), and titanium-aluminum (TiAl) and its compounds, including but not limited to titanium-aluminum-carbide (TiAlC), titanium-aluminum-oxide (TiAlO), titanium-aluminum-oxide-nitride (TiAlON), titanium-aluminum-carbon-chloride (TiAlCCl), and the like. In some embodiments, the gate electrode 252 comprises a void.

Figure 2J:
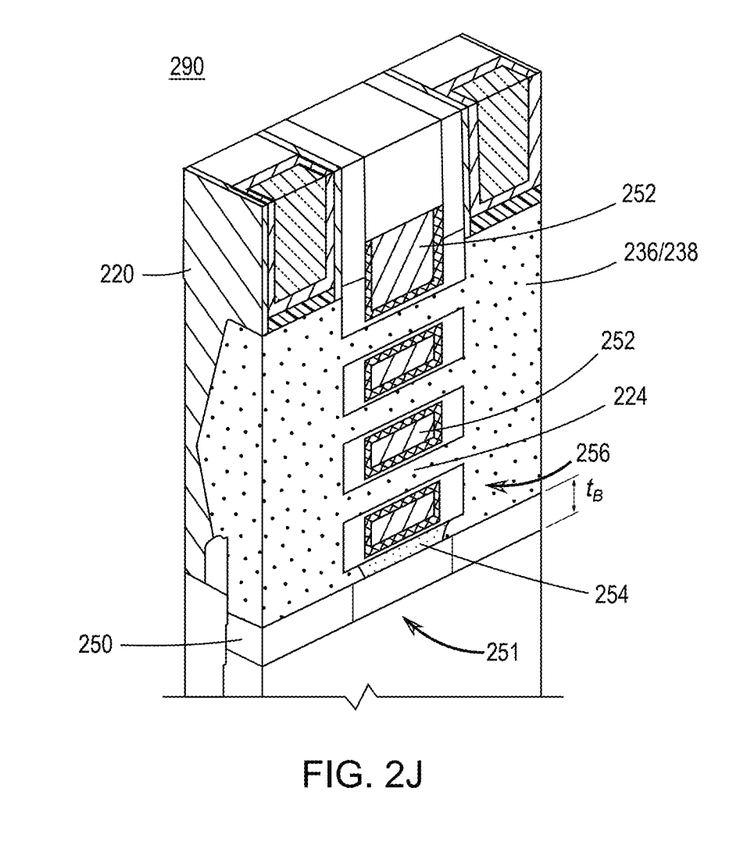
FIG. 2J illustrates a cross-section view of a device according to one or more embodiments.

Referring to FIG. 2J, the resultant device formed using the method described herein is a horizontal gate all around device, in accordance with an embodiment of the present disclosure. Some embodiments of the disclosure are directed to horizontal gate-all-around devices comprising channel layers 224 and a buried dielectric isolation (BDI) layer 250 and fully-depleted silicon-on-insulator (FD-SOI) 251 in the channel between source and drain regions 236/238. In one or more embodiments a silicon layer 254 is present under the plurality of channel layers 224 and metal gate structure 256.

One or more embodiments of the disclosure are directed to methods of forming a semiconductor device. In one or more embodiments, a method of forming a semiconductor device, comprises: forming a superlattice structure on a top surface of a substrate, the superlattice structure comprising a plurality of channel layers and a corresponding plurality of semiconductor material layers alternatingly arranged in a plurality of stacked pairs. A dummy gate is formed on a top surface of the superlattice structure. A source trench and a drain trench are formed adjacent to the superlattice structure, the plurality of semiconductor material layers extending between the source trench and the drain trench. An opening is formed on a bottom surface of the superlattice structure, and a buried dielectric isolation layer is formed in the source trench, the drain trench, and in the opening, the buried dielectric isolation layer having a thickness.

One or more embodiments are directed to a horizontal gate all around device. The GAA device of one or more embodiments comprises a plurality of channel layers between a source region and a drain region. The plurality of channel layers have a top surface, a bottom surface, and two side surfaces. A metal gate structure surrounds the plurality of horizontal channel layers. A silicon layer is on a bottom surface of the plurality of horizontal channel layers. The silicon layer has a top surface and a bottom surface. A buried dielectric isolation layer is on the bottom surface of the silicon layer extending from the source region to the drain region, the buried dielectric isolation layer disposed on a substrate.

Figure 3:
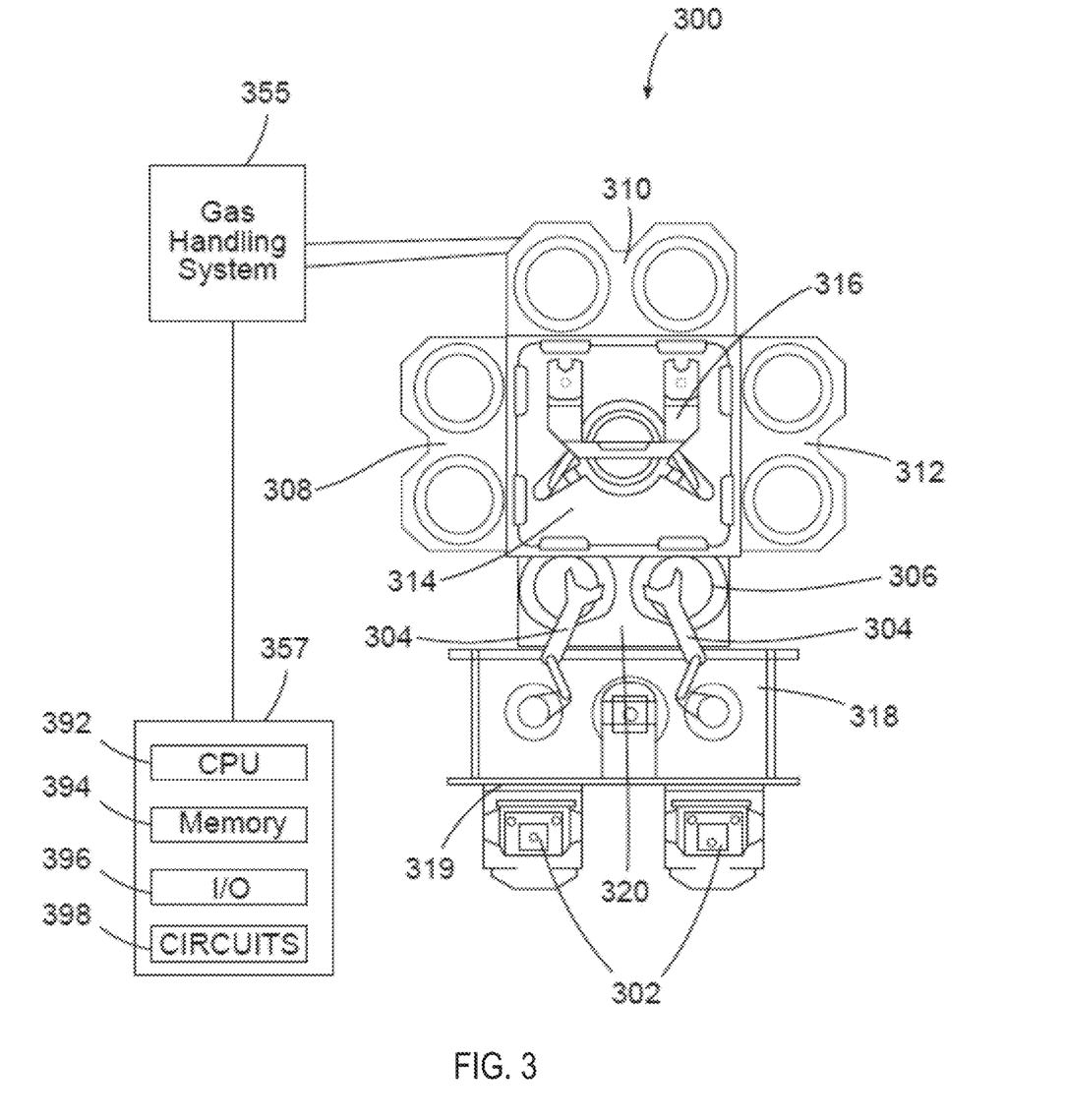
FIG. 3 illustrates a cluster tool according to one or more embodiments.

Additional embodiments of the disclosure are directed to processing tools 300 for the formation of the GAA devices and methods described, as shown in FIG. 3. A variety of multi-processing platforms may be utilized. The cluster tool 300 includes at least one central transfer station 314 with a plurality of sides. A robot 316 is positioned within the central transfer station 314 and is configured to move a robot blade and a wafer to each of the plurality of sides.

The cluster tool 300 comprises a plurality of processing chambers 308, 310, and 312, also referred to as process stations, connected to the central transfer station. The various processing chambers provide separate processing regions isolated from adjacent process stations. The processing chamber can be any suitable chamber including, but not limited to, a preclean chamber, a deposition chamber, an annealing chamber, an etching chamber, a selective etching chamber, and the like. The arrangement of process chambers and components can be varied depending on the cluster tool and should not be taken as limiting the scope of the disclosure. In one or more embodiments, the method may be performed in one or more processing chamber without breaking vacuum.

In some embodiments, the cluster tool 300 includes an isotropic etching chamber for forming opening the opening under the superlattice structure 204 and a deposition chamber for depositing the buried dielectric isolation (BDI) layer and fully-depleted silicon-on-insulator (FD-SOI) 250 in the opening. In some embodiments, the cluster tool 300 includes a pre-cleaning chamber connected to the central transfer station.

In the embodiment shown in FIG. 3, a factory interface 318 is connected to a front of the cluster tool 300. The factory interface 318 includes chambers 302 for loading and unloading on a front 319 of the factory interface 318.

The size and shape of the loading chamber and unloading chamber 302 can vary depending on, for example, the substrates being processed in the cluster tool 300. In the embodiment shown, the loading chamber and unloading chamber 302 are sized to hold a wafer cassette with a plurality of wafers positioned within the cassette.

Robots 304 are within the factory interface 318 and can move between the loading and unloading chambers 302. The robots 304 are capable of transferring a wafer from a cassette in the loading chamber 302 through the factory interface 318 to load lock chamber 320. The robots 304 are also capable of transferring a wafer from the load lock chamber 320 through the factory interface 318 to a cassette in the unloading chamber 302.

The robot 316 of some embodiments is a multi-arm robot capable of independently moving more than one wafer at a time. The robot 316 is configured to move wafers between the chambers around the transfer chamber 314. Individual wafers are carried upon a wafer transport blade that is located at a distal end of the first robotic mechanism.

A system controller 357 is in communication with the robot 316, and a plurality of processing chambers 308, 310 and 312. The system controller 357 can be any suitable component that can control the processing chambers and robots. For example, the system controller 357 can be a computer including a central processing unit (CPU) 392, memory 394, inputs/outputs 396, suitable circuits 398, and storage.

Processes may generally be stored in the memory of the system controller 357 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the system controller 357 has a configuration to control the isotropic etching chamber to form the opening under the superlattice structure 204 and to control the deposition chamber to deposit the buried dielectric isolation (BDI) layer and fully-depleted silicon-on-insulator (FD-SOI) 250.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising an isotropic etching chamber and a buried isolation layer deposition chamber; and a controller connected to the central transfer station and the plurality of process stations, the controller configured to activate the robot to move the wafer between process stations, and to control a process occurring in each of the process stations.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A semiconductor device comprising:
    a plurality of horizontal channel layers extending between a source region and a drain region, the plurality of horizontal channel layers having a top surface, a bottom surface, and two side surfaces;
    a metal gate structure adjacent each of the plurality of horizontal channel layers; and
    a fully-depleted silicon-on-insulator (FD-SOI) transistor below the plurality of horizontal channel layers and the metal gate structure, the fully-depleted silicon-on-insulator (FD-SOI) transistor including
    a silicon layer below the metal gate structure extending between the source region and the drain region, the silicon layer having a top surface and a bottom surface; and
    a buried dielectric isolation layer directly on the bottom surface of the silicon layer and extending the entire length of the source region and the drain region, the buried dielectric isolation layer disposed on a substrate.

2. The device of claim 1, wherein the buried dielectric isolation layer has a thickness in a range of from 0 nm to 10 nm.

3. The device of claim 2, wherein the buried dielectric isolation layer has a thickness in a range of from 3 nm to 7 nm.

4. The device of claim 1, wherein the plurality of horizontal channel layers comprise one or more of silicon (Si), germanium (Ge), and silicon germanium (SiGe).

5. The device of claim 1, wherein the source region and the drain region independently comprise one or more of silicon (Si), germanium (Ge), and silicon germanium (SiGe).

6. The device of claim 5, wherein the source region and the drain region are independently doped with one or more of phosphorus (P), arsenic (As), boron (B), and gallium (Ga).

7. The device of claim 6, wherein the source region and the drain region independently have a doping concentration in a range of from $1e19$ $cm^{-3}$ to $5e21$ $cm^{-3}$.

8. The device of claim 1, wherein the buried dielectric isolation layer comprises one or more of silicon oxide ($SiO_x$), silicon nitride (SiN), silicon carbide (SiC), and a high-k material.

9. The device of claim 1, wherein the plurality of horizontal channel layers have a doping concentration in a range of from $1e14$ $cm^{-3}$ to $1e19$ $cm^{-3}$.

10. The device of claim 1, wherein the metal gate structure comprises one or more of titanium nitride (TiN), tantalum nitride (TaN), tungsten (W), titanium-aluminum (TiAl), and titanium-aluminum (TiAl) compounds.

11. The device of claim 1, wherein the silicon layer has a thickness in a range of from 0 nm to 10 nm.

12. The device of claim 1, wherein the metal gate structure is above and below each of the plurality of horizontal channel layers.

* * * * *